(12) United States Patent
Charlet et al.

(10) Patent No.: US 8,478,553 B2
(45) Date of Patent: Jul. 2, 2013

(54) SYSTEM FOR CALCULATING RESISTIVE VALUES FOR MICROELECTRONICS CAD

(75) Inventors: Francois Charlet, Grenoble (FR); Mathias Silvant, Voiron (FR)

(73) Assignee: Edxact, Voiron (FR)

( * ) Notice: Subject to any disclaimer, the term of this patent is extended or adjusted under 35 U.S.C. 154(b) by 358 days.

(21) Appl. No.: 12/497,394

(22) Filed: Jul. 2, 2009

(65) Prior Publication Data
US 2010/0004886 A1 Jan. 7, 2010

(30) Foreign Application Priority Data
Jul. 4, 2008 (FR) ..................................... 08 54580

(51) Int. Cl.
*G01R 27/00* (2006.01)
*G01R 31/14* (2006.01)

(52) U.S. Cl.
USPC .............. 702/65; 702/117; 702/118; 702/196

(58) Field of Classification Search
USPC .. 702/65, 57, 196, 64, 117, 118, 189; 703/13, 703/14; 716/55, 100, 102, 107, 119, 126, 716/136, 139
See application file for complete search history.

(56) References Cited

U.S. PATENT DOCUMENTS

| | | | | |
|---|---|---|---|---|
| 5,050,091 | A * | 9/1991 | Rubin | 716/122 |
| 5,568,558 | A | 10/1996 | Ramm et al. | |
| 6,871,334 | B2 * | 3/2005 | Mabuchi et al. | 716/115 |
| 7,277,804 | B2 | 10/2007 | Gebbie et al. | |
| 7,315,212 | B2 | 1/2008 | Floyd et al. | |
| 2001/0029601 | A1 * | 10/2001 | Kimura et al. | 716/19 |
| 2005/0288914 | A1 | 12/2005 | Gebbie et al. | |
| 2006/0004551 | A1 | 1/2006 | Freund | |
| 2006/0031055 | A1 | 2/2006 | Sheehan | |
| 2007/0005325 | A1 | 1/2007 | Gong et al. | |
| 2007/0299647 | A1 | 12/2007 | Bolcato et al. | |
| 2008/0133201 | A1 | 6/2008 | Guedon | |
| 2009/0172613 | A1 | 7/2009 | Suaya et al. | |

FOREIGN PATENT DOCUMENTS
WO 2007/051838 A1 5/2007

OTHER PUBLICATIONS

Chen, Wai-Kai, "The circuits and filters handbook", CRC Press, XP002523235, pp. 1271-1273 (2003).
De Berg, M. et al., "Computational Geometry: Algorithms and applications", Springer-Verlag, pp. 183-211 (1997).
Horowitz, Mark et al., "Resistance Extraction from Mask Layout Data", IEEE Transactions on CAD, CAD-2(3): pp. 145-150 (Jul. 1983).
Kanapka, Joe et al., "Fast Methods for Extraction and Sparsification of Substrate Coupling", in 37th Design Automation Conference, pp. 738-743 (2000).
Kapur, Sharad et al., "Large-Scale Capacitance Calculation", in 37th Design Automation Conference, pp. 744-749 (2000).

(Continued)

*Primary Examiner* — Phuong Huynh
(74) *Attorney, Agent, or Firm* — Nixon Peabody LLP

(57) ABSTRACT

A method for calculating resistive values of an electronic circuit represented in the form of masks and connections includes defining the circuit in the form of a first list of electrical components and connections between them, identifying circuit entry and exit ports, selecting part of the resistive components of the circuit alone, producing a matrix of resistances of the resistive components alone selected in the previous step, and calculating equivalent resistances.

7 Claims, 7 Drawing Sheets

OTHER PUBLICATIONS

Kerns, Kevin J. et al., "Preservation of Passivity During RLC Network Reduction via Split Congruence Transformations", Dept. Electrical Engineering, University of Washington, pp. 34-39 (1997).

Kerns, Kevin J. et al., "Stable and Efficient Reduction of Large, Multiport RC Networks by Pole Analysis via Congruence Transformation", IEEE Transactions on Computer-Aided Design of Integrated Circuits and Systems, 16(7), pp. 734-744 (Jul. 1997).

Krauter, Byron et al., "Layout Based Frequency Dependent Inductance and Resistance Extraction for On-Chip Interconnect Timing Analysis", in 35th Design Automation Conference, pp. 303-308 (1998).

Lai, Glenn G. et al., "Hinted Quad Trees for VLSI Geometry DRC Based on Efficient Searching for Neighbors", IEEE Transactions on Computer-Aided Design, 15(3): 317-324 (Mar. 1996).

Lehoucq, R.B. et al., "Deflation Techniques for an Implicitly Restarted Arnoldi Iteration", SIAM Journal on Matrix Analysis and Applications, vol. 17, pp. 789-821 (Oct. 1996).

Odabasioglu, Altan et al., "Pracical Consideations for Passive Reduction of RLC Circuits", IEEE, pp. 214-219 (1999).

Odabasioglu, Altan et al., PRIMA: Passive Reduced-Order Interconnect Macromodeling Algorithm, IEEE, pp. 58-65 (1997).

Pong, Teng-Sin et al., "A Parasitics Extraction and Network Reduction Algorithm for Analog VLSI", IEEE Transactions on Computer-Aided Design, vol. 10(2), pp. 145-149 (Feb. 1991).

Radke, Richard J., "A Matlab Implementation of the Implicitly Restarted Arnoldi Method for Solving Large-Scale Eigenvalue Problems", Dept. of Computational and Applied Math, Rice University, Houston, Texas, pp. 1-94 (Apr. 1996).

Sorensen, D.C., "Implict Application of Polynomial Filters in a K-Step Arnoldi Method", SIAM J. Matrix Anal. Appl., vol. 13(1), pp. 357-385 (Jan. 1992).

van der Meijs, N.P. et al., "An Efficient Finite Element Method for Submicron IC Capacitance Extracton", 26th ACM/IEEE Design Automation Conference, 5 pgs. (1989).

Vanoostende, Paul et al., "DARSI: RC Data Reduction", IEEE Tansactions on Computer-Aided Design of Integrated Circuits and Sysems, No. 4, New York, pp. 493-500 (Apr. 1991).

International Search Report dated Feb. 2, 2007, PCT/EP2006/068074.

French Preliminary Search Report dated Jul. 8, 2006, FR 0553354.

French Preliminary Search Report dated Jan. 5, 2009, FR 0853661.

French Preliminary Search Report dated Apr. 8, 2009, FR 0854580.

U.S. Appl. No. 12/477,846, filed Jun. 3, 2009.

Office Action in U.S. Appl. No. 12/477,846, mailed Jul. 6, 2011.

Office Action in U.S. Appl. No. 11/795,511, mailed Aug. 16, 2011.

Chan, S. C. et al. "Practical Considerations in RLCK Crosstalk Analysis for Digital Integrated Circuits," Proc. of the IEEE/ACM International Conference on Computer-Aided Design, 2001, 7 pages.

Office Action in U.S. Appl. No. 11/795,511, dated Jul. 23, 2010.

Office Action in U.S. Appl. No. 11/795,511, Jan. 20, 2011.

\* cited by examiner

SYSTEM FOR CALCULATING RESISTIVE VALUES FOR MICROELECTRONICS CAD

CROSS REFERENCE TO RELATED APPLICATIONS OR PRIORITY CLAIM

This application claims priority of French Patent Application No. 08 54580, filed Jul. 4, 2008.

DESCRIPTION

Technical Domain and State of Prior Art

The invention relates to the domain of integrated circuits and methods and devices used to design integrated circuits.

The design of an integrated circuit comprises several steps to transfer an electrical description into a masks drawing. These masks are eventually used to make the integrated circuit. For the last few years, it has been possible to design integrated circuits with minimum dimensions equal to or less than 90 nm. Miniaturisation reduces power supply voltages and provides the means of integrating many more components of the same size. The result is hundreds of millions of transistors per integrated circuit for a microprocessor or for circuits comprising memory blocks. The counterpart of miniaturisation is that sensitivity to disturbances in circuits increases. Furthermore, the number of unpredicted effects related to extremely small dimensions is increasing sharply. Therefore it is normal that the design steps should now include verification steps. These verifications are intended to make sure that there is a good chance that the circuit will work once it has been made. Since it is very expensive to make a set of masks (for example more than $1.5 million), it is important to make as many tests on the mask drawing as possible to detect all possible errors.

For example, one category of problems to be tested consists of verifying if the electrical characteristics of the inputs to an integrated circuit respect the specifications concerning immunity against electrostatic discharges.

In particular, efforts are being made to estimate resistive values between inputs and outputs to an electric network in this circuit. For example, knowledge of these values can make it possible to evaluate whether two electrical lines have the same resistance to current, or if an electrical line is well adapted to the output from a block or a component.

When verifying immunity against electrostatic discharges, it is important to know whether or not the resistance between an external contact and the first designed components remains below a given threshold. The resistance may be too high due to the length of interconnections between modern integrated circuits and because they are so small, and design errors can also cause problems.

At the present time, the designer has two solutions:
  make a complete simulation, measure currents and voltages and calculate equivalent resistances,
  or use a very simplified approach to estimate equivalent resistances, for example as described in US 2005/0288914 A1.

FIG. 1 illustrates a sequence of steps showing the first solution.

The starting point (S1) is a netlist 10, or transcription of an electrical circuit containing components and connections between components or electrical networks that connect the designed components. In general, connections are modelled with linear electrical components such as resistors. This netlist is in the form of a file in a format that can be read by the computer and by an operator.

The next step (S2) is the initial step in an iteration loop; this step concerns the connection of voltage sources to certain electrical network input and output ports.

Other ports are connected to the ground in a step S3.

A simulation S4 is made in each iteration loop to determine currents. Currents are then measured (step S5). Finally, the resistances will be calculated (step S6) by dividing injected voltages by the measured currents.

To simplify the description, it can be assumed that the netlist only contains components that model interconnections. It could also be assumed that it only contains resistors. The netlist thus contains only a certain number of purely resistive networks connected to each other.

Despite this possible simplification, this first solution has the disadvantage that the designer needs to manually add current sources to the circuit under investigation, make several simulations and perform calculations to obtain precise results. Therefore, this approach occupies considerable resources and manual manipulation errors are fairly common.

For example, FIGS. 2A, 2B and 2C show a small electrical network with 5 input ports P1-P5. Between these ports, there is a purely resistive electrical network 230 (FIG. 2B). This network is composed of resistors R1 to R6 that are connected to each other. More globally, the network can be seen as a black box 220 (FIG. 2A), for which the exact contents are not known.

The designer of an integrated circuit is then interested in knowing the resistance between input pairs P1-P2, P1-P3, P1-P4, P1-P5, P2-P3, P2-P4, P2-P5, P3-P4, P3-P5 and P4-P5. To achieve this, an iteration has to be made that connects a voltage source 410 for example to P1-P2 (FIG. 2C) and that short circuits the other inputs P3, P4 and P5 through the ground 420.

A simulation is then made to determine the current $I_{12}$. The resistance between the two ports P1 and P2 is then determined by dividing the voltage $V_{12}$ by the current $I_{12}$.

The resistances associated with the other pairs of ports are determined by removing the connections and putting them back into place so as to isolate the ports in question according to the example described above.

It can be understood that despite its simplicity, this approach has the disadvantage that it is not automated and requires a great deal of simulation time.

A typical simulation of a combination of ports takes about 1 second in time. The number N of combinations of port n to be calculated is then:

$$N=n(n-1)/2$$

A precise calculation of 1000 combinations takes at least 499,500 seconds, therefore almost 6 full days.

The simulation becomes very slow for large networks (1000 ports) and cannot be used for larger networks (1 million ports or more).

The second solution proposed industrially is as described in document US 2005/0288914 A1. It uses a fairly drastic approach to transform an entire electrical network into a single resistor. This approach can be used to estimate values with an extremely high degree of uncertainty.

This calculation is no longer suitable for a precise calculation like that necessary for 65 nm and smaller technological nodes, due to its very bad precision.

In summary, there is no effective solution for a precise calculation of the resistances in an electrical network that can be used in the verification of mask drawings once integrated circuits have been designed.

Therefore, the problem of finding a new method and a new device for making such a precise calculation arises.

PRESENTATION OF THE INVENTION

The invention proposes a method and a system to solve these problems.

The invention relates firstly more specifically to a method of calculating resistive values of an electronic circuit represented in the form of masks and connections, comprising:
  a) definition of the circuit in the form of a first list of electrical components and connections between them;
  b) identification of circuit entry and exit ports;
  c) selection of part of the resistive components of the circuit alone;
  d) production of a matrix of resistances of the resistive components alone selected in the previous step;
  e) calculation of equivalent resistances.

Step d) may be applied by doing a breakdown of the selected resistive network in the form of vertices and branches.

Thus, it can comprise the following sub-steps:
  definition of a resistive network with $N_c$ vertices $\{v_1, \ldots, v_{Ns}\}$ and $N_b$ branches $\{u_1, \ldots, u_{Nb}\}$, each branch being associated with a resistor $R_i$;
  construction of a tree T with size $N_t$ of the network and the associated co-tree CT;
  writing meshed equations;
  writing the matrix of resistances.

Step e) may comprise a reduction in the matrix of resistances by integrating cycle equations.

The invention also relates to a device for calculating resistive values of an electronic circuit, represented in the form of masks and connections, comprising:
  a) means of receiving the definition of the circuit in the form of a first list of electrical components and the connections between them;
  b) means of identifying circuit entry and exit ports;
  c) means of selecting only some of the resistive components of the circuit alone;
  d) means of producing a matrix of resistances of the selected resistive components, for example by breaking down the network composed of the different resistive components selected in the form of vertices and branches;
  e) means of calculating equivalent resistances.

The invention also relates to a data medium that can be read by the computer, comprising instructions for implementing a method according to the invention.

DETAILED PRESENTATION OF PARTICULAR EMBODIMENTS

As previously indicated, this invention is a system for calculating equivalent resistances between input and output ports in an electrical network. Knowledge of precise values of the resistances is important information for the design of integrated circuits.

Figure 1:
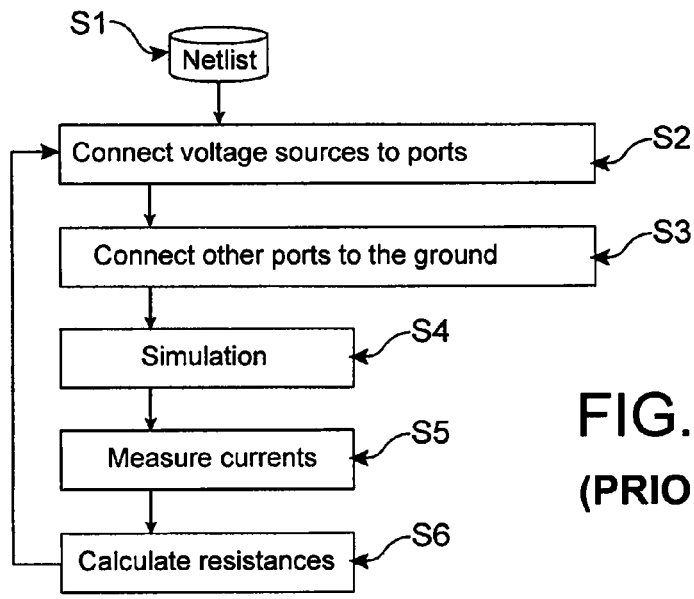
FIG. 1 shows the steps in a method according to prior art, that uses simulation by iteration.
Figure 2A:
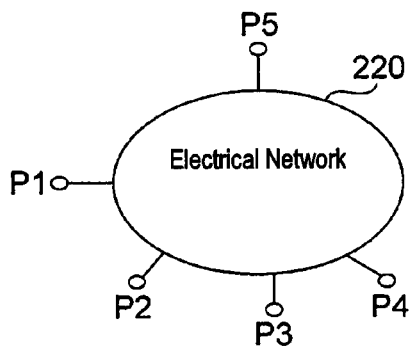
FIGS. 2A-2C show a first prior art simulation approach for verifying electrical characteristics of inputs of an integrated circuit.
Figure 2B:
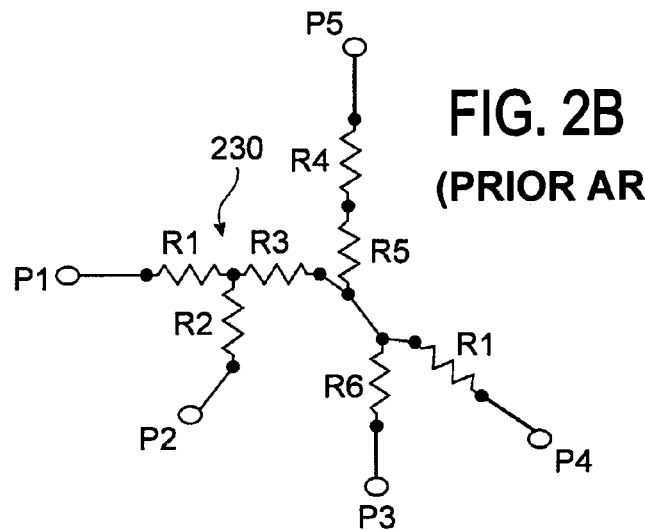
Figure 2C:
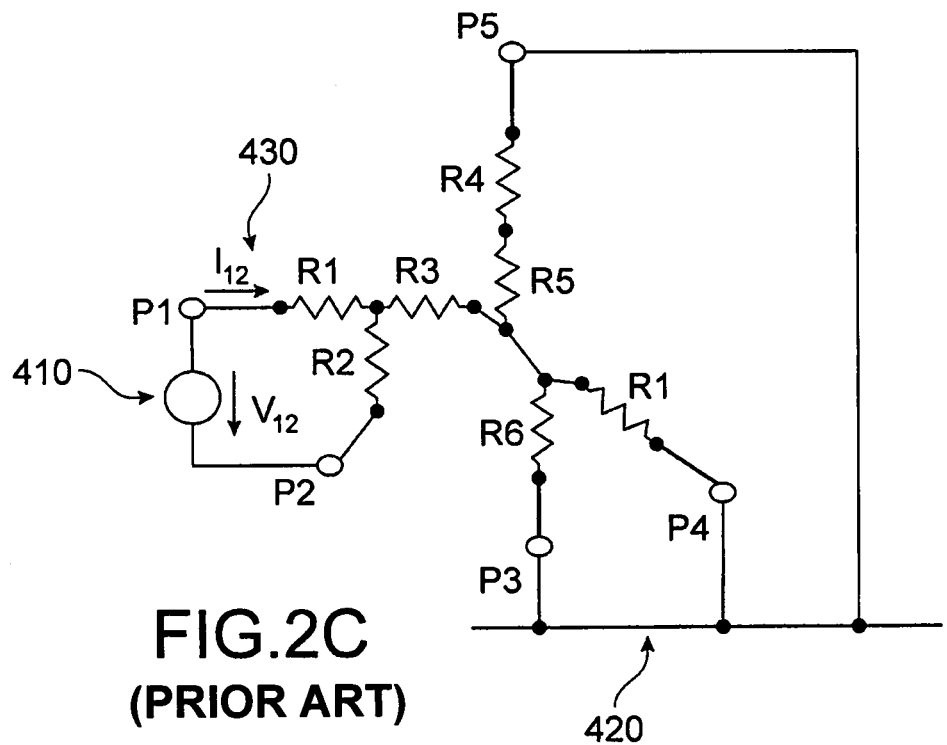
Figure 3:
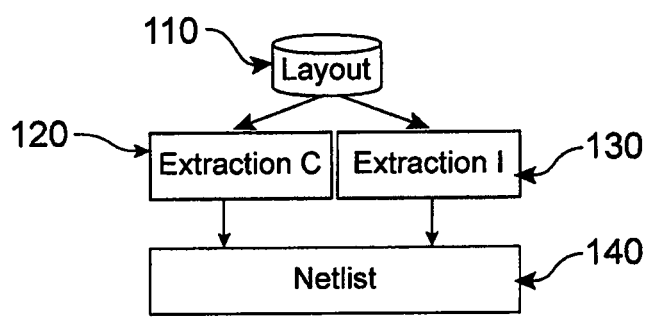
FIG. 3 shows steps in a method to produce a netlist.

We will start by using FIG. 3 to explain how a <<netlist>> is obtained.

The process starts from the lithographic masks drawing 110, or from a computer description of these masks. This drawing shows a diagram of the layers in the different components (geometry) and their connections in the circuit.

These masks are organised in layers, and each of these layers contains geometric forms that will act as negatives when the circuit is being manufactured.

Each layer also contains the profiles or technological information, in other words the technical characteristics of materials such as the impedance as a function of the distance between components, the relative permittivity, the permeability of materials and the temperature, or the characteristics of diffusions, doping profiles, etc. For example, each material has its own resistivity per segment. A segment has a limited section and length.

The set of segments for all components or geometric elements defines the resistive network.

This description of the mask drawing is also called a <<layout>> 110.

This description is provided to one or two extraction programs: a first computer program 120 called the <<C>> Extraction software extracts the drawn circuit, and the second program 130 called the extraction <<I>> software extracts interconnections from the masks drawing, using technological information like mentioned above associated with the layout 110.

The following contains examples of these computer programs:

For program 120, Cadence Design Systems' <<Assura>>, Mentor Graphics' <<Calibre>>, or Synopsys's <<Star>> software.

For program 130, extensions can be used for interconnections of the software mentioned above, and particularly Cadence Design Systems' <<Assura RCX>>, Mentor Graphics' <<Calibre XRC>>, or Synopsys's <<Star RCXT>> software.

The result of these two extractions is a list of electrical components and interconnections between these components, called the netlist 140.

In other words, this netlist is an electrical description of the integrated circuit that comprises a list of components (all component types—resistors, capacitors, inductors, etc.) recognised in step 120 or 130 and connections between these components.

This description may be memorised in a database or in an electronic file that can be read by a computer and/or by an operator.

Figure 4:
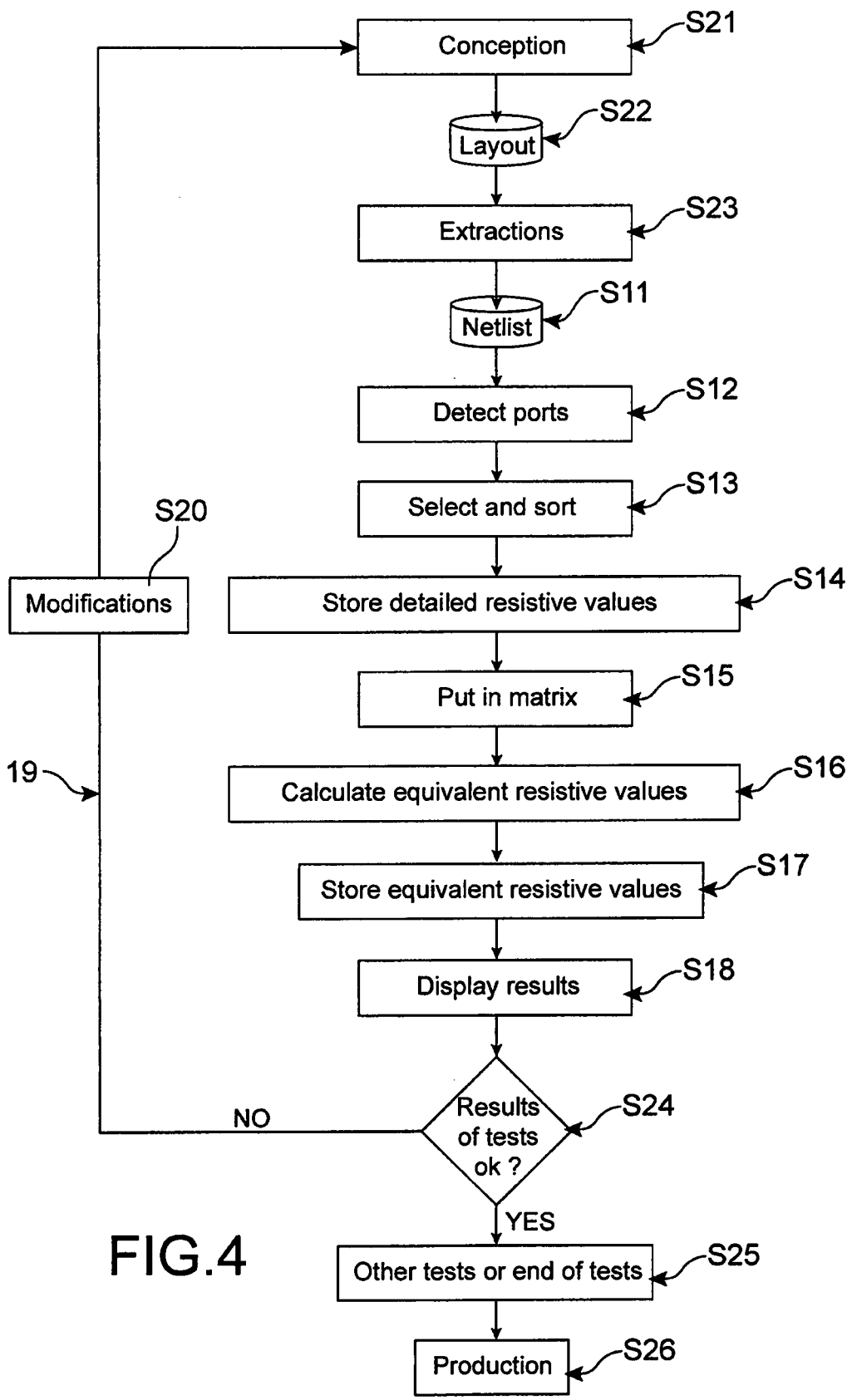
FIG. 4 shows steps in a method according to the invention.

FIG. 4 represents the steps in a method according to the invention.

Such a method starts from a design step S21 (mainly comprising placement and routing) that generates a database containing the description of masks, in other words the layout S22. Extractions are then made (S23) as described above. The result of the extractions is a netlist S11.

The netlist may be of the generalised type, and therefore it may contain active elements and components modelling the interconnections.

The first step S12 is to detect the ports. The term <<port>> is used relative to an electrical network that models interconnections between electrical components integrated on an integrated circuit. In particular, it refers to:

external ports, like connections between the external world and the integrated circuit;

component ports, therefore inputs to and outputs from components attached to the interconnections network.

Figure 9:
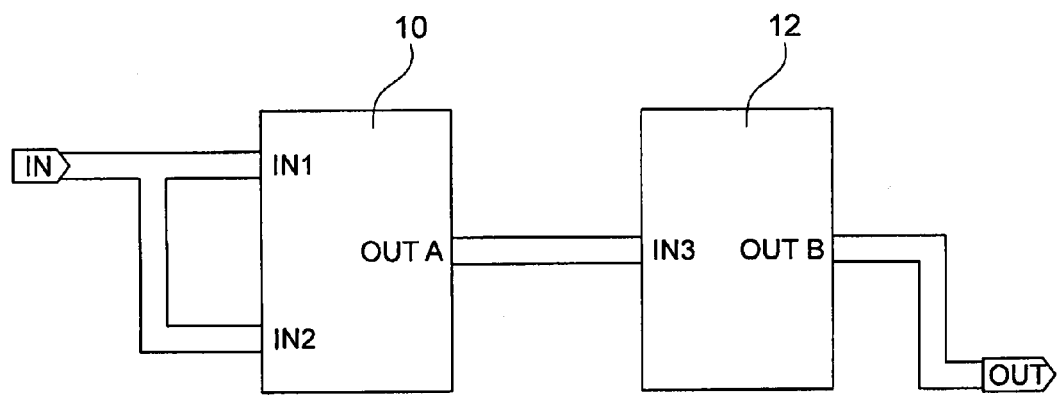
FIG. 9 represents the electrical scheme for a small electrical circuit with two components, and their ports.

FIG. 9 describes this concept of ports. It represents the electrical schematic of a small electric circuit with two components 10, 12. <<IN>> denotes an external port and <<OUT>> denotes an external port. These ports link the outside world with the two integrated components 10, 12. Each component has inputs and outputs relative to the interconnection network between the outside ports and components. Therefore, in this example there are the <<IN1>>, <<IN2>>, <<OUTA>>, <<IN3>> and <<OUTB>> ports between components.

A sort and selection (step s13) can then be done. A designer is not always interested in all components or even all resistors. Therefore, he may choose to study only a subset of the network. Active components should be excluded from the calculation, and capacitive and inductive values should be removed from networks. With this invention, the user can choose a subset of the network and therefore, for example, eliminate capacitive and inductive values of the corresponding components.

Purely resistive values are stored in a database (step S14). These resistive values are then put into matrix form (step S15) as described below.

Equivalent resistances are calculated in the next step (step s16). These are then stored (step s17) in a database that may be another base of the type described previously, or the type used during step S14 in which the data present have already been overwritten.

The results can then:

be displayed (step S18);

and put in the form of files for automated design methods.

Tests will be carried out (S24) as a function of criteria specified by the user of this verification system. These tests may be manual or automated.

For example, example tests might answer the following questions:

a. Is the value of each equivalent resistance calculated for each combination less than X ohms?

b. Is the resistance of each combination more than Y ohms?

c. Are there any short circuits in the networks?

If the results are good, tests related to the resistive network are accepted and other tests can be done (S25). It is also possible for these tests to be carried out at the end of the verification system and that production of integrated circuits then starts (S26).

Modifications may be made (return to S21) if any problems are detected during the tests s24. For example, if the resistance is too high, a correction can be made by increasing the width of some interconnections. The layout then appears modified (s22) and new extractions can be made (S23) to be included in the calculation of resistances in order to repeat the tests (S24).

The procedure for each of the steps s15 and s16 will be described in greater detail with reference to FIGS. 5 and 6. These steps are applied to an example of the circuit shown in FIG. 7A (that shows the voltages ui (i=1, ..., 6) at the terminals of components and the potentials vj=1, ..., 5) at the ports), and FIG. 7B (that shows currents circulating in the components and voltages at ports). To simplify the description, it will be assumed that all the resistances of this circuit are equal to R.

We will use the vocabulary of graph theory in the remainder of this description, for which we will define a number of concepts, before starting the description of the next step. The book by R. Faure et al. <<Précis de recherche opérationnelle>> (Operational Research Summary), Dunod, 2000 contains explanations about graph theory.

We start by considering points A, B, C, D, E of a space that are interconnected by several arrows (or <<branches>> or <<arcs>>).

For each point (<<vertex>> or node) of the set X={A, B, C, D, E}, there is a subset of X that is defined for this vertex by following the arrows attached to it. For example, if there is one arrow from vertex A to vertex B and another arrow from A to C, the subset of A is r{A}={B, C}.

The arcs of a non-oriented graph are called <<edges>>.

In a graph, a "path" is a sequence of arcs, in which the terminal end of each arc (except for the last) is the starting point of the next arc. A path that is closed on itself is called a "circuit". The length of a path is equal to the number of its arcs. A circuit with length 1 is a <<loop>>.

A "chain" is a series of edges, each of which has a common end with the previous edge (except for the first) and with the next edge (except for the last).

A graph is said to be <<connected>> if there is at least one chain between each pair of vertices or nodes. A "tree" is a connected graph without any cycles. A <<co-tree>> is obtained by breaking a graph down into several independent trees.

Figure 5:
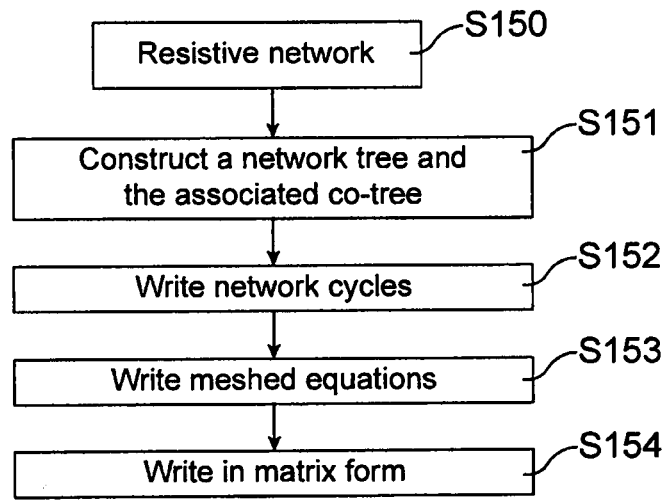
FIGS. 5 and 6 are detailed steps of a method according to the invention.
Figure 6:
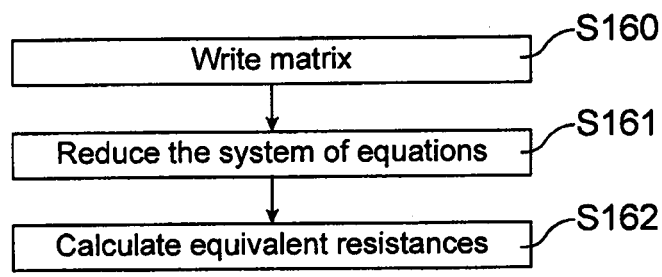

Step S15, broken down in FIG. 5, firstly breaks the selected resistive network down in the form of vertices and branches.

Consider a resistive network (S150) with $N_c$ vertices $\{v_1, \ldots, v_{Ns}\}$ and $N_b$ branches $\{u_1, \ldots, u_{Nb}\}$. Each branch is associated with a resistor $R_i$.

According to one sub-step S151 in step S15, a tree T of the network with size $N_t$ is built up with the associated co-tree CT.

Figure 7A:
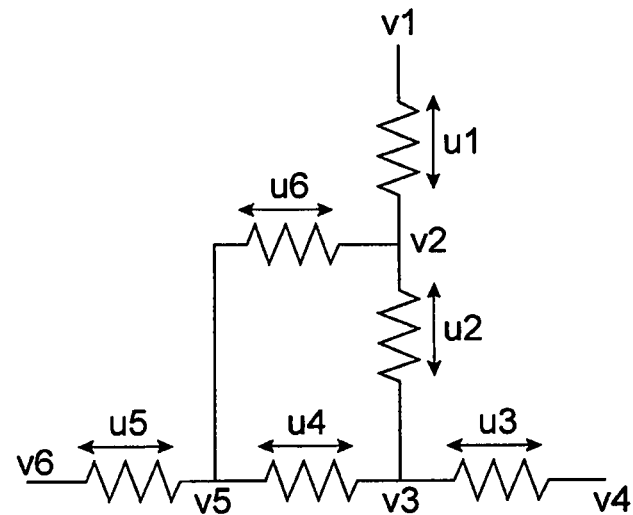
FIGS. 7A and 7B show an electrical circuit to which the invention is applied.
Figure 7B:
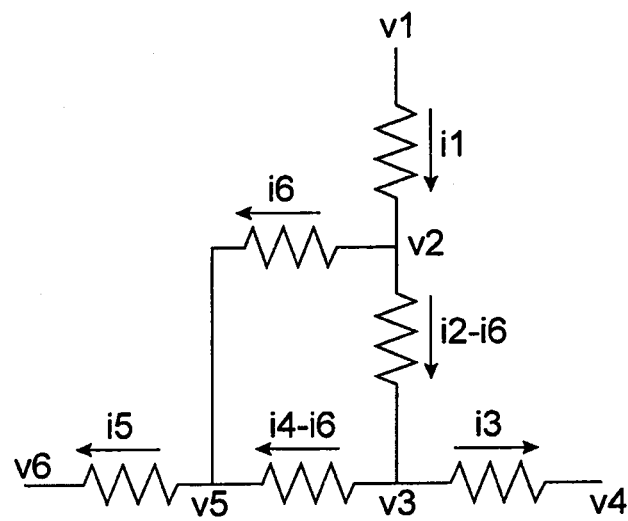

Therefore, for the example in FIG. 7A, we obtain the following tree:

$$T=\{u1,u2,u3,U4,u5\}, Nt=5 \quad [1]$$

and the co-tree:

$$CT=\{u6\} \quad [2]$$

The cycles in the network are written during the next sub-step S152. Each branch of a co-tree results in a cycle. The result obtained is $N_c$ cycles.

In the example chosen, the number of cycles $N_c$ is calculated as follows:

$$Nc=1 \quad [3]$$

in which cycle c is:

$$c=\{u6,-u2,-u4\} \quad [4]$$

A sub-step s153 concerns writing of meshed equations based on Kirchhoff's laws. Currents $\{i_1, \ldots, i_{Nb}\}$ associated with the branches are introduced and the associated meshed equations are written. We also write that the sum of the voltages is zero for each cycle.

The voltages and currents associated with branches of the tree are denoted $U_T$, $I_T$ respectively. Therefore, in the example chosen, we obtain:

$$U_T = \begin{Bmatrix} u1 \\ u2 \\ u3 \\ u4 \\ u5 \end{Bmatrix}$$

-continued $$I_T = \begin{Bmatrix} i1 \\ i2 \\ i3 \\ i4 \\ i5 \end{Bmatrix}$$

The currents associated with the cycles are denoted $I_C$:

$$I_C = \{i6\}$$

The following are also used for the matrix description of the system:

the vector of branch resistors $R_{TT}$ of the tree T;

the vector of resistors of co-tree CT, connected in parallel;

and the vector of resistors of co-tree CT.

The vector of branch resistors RTT of tree T is written as follows:

$$R_{TT} = \begin{Bmatrix} R1 \\ R2 \\ R3 \\ R4 \\ R5 \end{Bmatrix}$$

The vector of resistances of co-tree CT connected in parallel is written:

$$R_{CT} = \{0, -R2, 0, -R4, 0\}$$

Finally, the vector of resistors of the co-tree CT is written:

$$R_{CC} = \{R6\}$$

Therefore, the following matrix description of the system is obtained (S154):

$$\begin{bmatrix} R_{TT} & R_{CT}^T \\ R_{CT} & R_{CC} \end{bmatrix} \begin{bmatrix} I_T \\ I_C \end{bmatrix} = \begin{bmatrix} U_T \\ 0 \end{bmatrix} \quad [5]$$

The following system [6] is obtained for the case shown in FIG. 5A:

$$u_1 = R_1 i_1$$

$$u_2 = R_2(i_2 - i_6)$$

$$u_3 = R_3 i_3$$

$$u_4 = R_4(i_4 - i_6)$$

$$u_5 = R_5 i_5$$

$$0 = R_6 i_6 - R_2(i_2 - i_6) - R_4(i_4 - i_6)$$

In the example used, it is assumed that all resistors $R_i$ are equal to R, to simplify the calculation. The matrix R is then as follows [7]:

$$\begin{bmatrix} R & 0 & 0 & 0 & 0 & 0 \\ 0 & R & 0 & 0 & 0 & -R \\ 0 & 0 & R & 0 & 0 & 0 \\ 0 & 0 & 0 & R & 0 & -R \\ 0 & 0 & 0 & 0 & R & 0 \\ 0 & -R & 0 & -R & 0 & 3R \end{bmatrix} \begin{bmatrix} i_1 \\ i_2 \\ i_3 \\ i_4 \\ i_5 \\ i_6 \end{bmatrix} = \begin{bmatrix} u_1 \\ u_2 \\ u_3 \\ u_4 \\ u_5 \\ 0 \end{bmatrix}$$

Equivalent resistive values can be calculated using this matrix; this is step s16 in FIG. 4, which will be described in detail with reference to FIG. 6.

After writing the matrix relation S160, the system of matrix equations will be reduced during a sub-step S161, by integrating equations of cycles c by substitution.

Therefore, with:

$$R_{TT}*I_T + R_{CT}^T*I_C = U_T$$

and:

$$R_{CT}*1_T + R_{CC}*1_C = 0 \Rightarrow -R_{CC}^{-1}*R_{CT}*1_T = 1_C$$

we obtain:

$$R_{TT}*I_T - (R_{CT}^T*R_{CC}^{-1}*R_{CT})I_T = U_T$$

The result is then a matrix R of resistances associated with the tree T:

$$(R_{TT} - R_{CT}^T R_{CC}^{-1} R_{CT})U_T = I_T \quad [8]$$

Therefore:

$$R^T = (R_{TT} - R_{CT}^T R_{CC}^{-1} R_{CT}) \quad [9]$$

For the example in FIG. 7A, the following matrix $R^T$ is obtained [10]:

$$(R^T)\begin{bmatrix} R & 0 & 0 & 0 & 0 \\ 0 & \frac{2}{3}R & 0 & \frac{-1}{3}R & 0 \\ 0 & 0 & R & 0 & 0 \\ 0 & \frac{-1}{3}R & 0 & \frac{2}{3}R & 0 \\ 0 & 0 & 0 & 0 & R \end{bmatrix} \begin{bmatrix} i_1 \\ i_2 \\ i_3 \\ i_4 \\ i_5 \end{bmatrix} = \begin{bmatrix} u_1 \\ u_2 \\ u_3 \\ u_4 \\ u_5 \end{bmatrix}$$

$R^T$ is then used to quickly calculate the equivalent resistances (step S162) without making successive simulations. The equivalent resistance between two ports i and j is calculated by inputting fixed currents in i and j, for example with a value equal to +1 in i and a value equal to −1 in j. The required resistance is obtained starting from the voltage between the two ports i, j and the currents input in i and j.

Figure 8A:
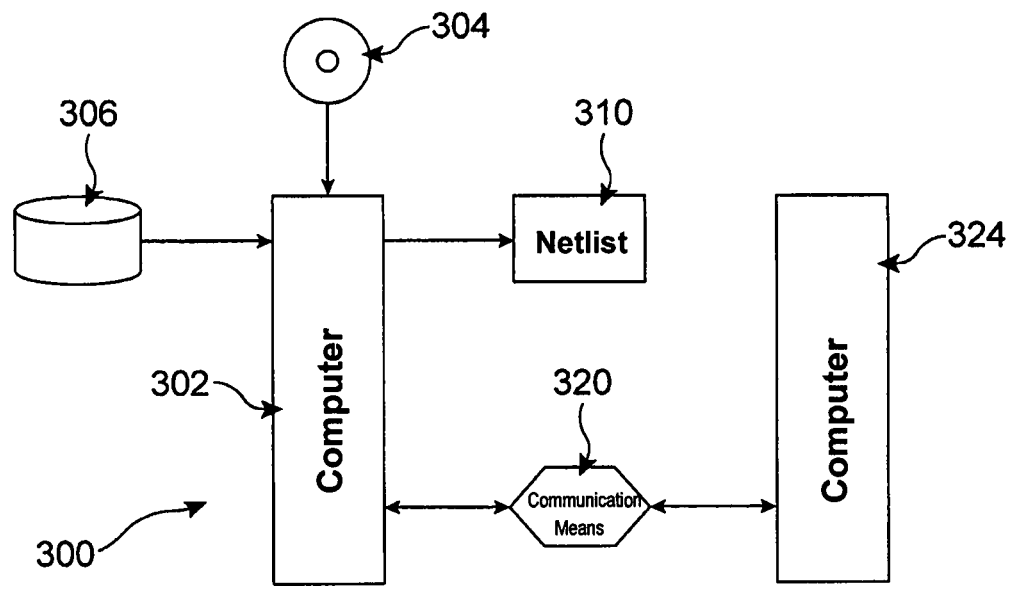
FIGS. 8A and 8B diagrammatically show a device for implementing a method according to the invention.

FIG. 8A shows a computer system 300 that can be used to implement this invention. A computer 302 receives a set of instructions programmed on a medium 304 that can be read by the computer, such as a CD-ROM, DVD, tape, USB key, or a direct link with another computer. The computer executes instructions to read all or some of the description of a mask drawing starting from a database 306 or any other storage medium, and then to calculate a netlist 310 that will be used to start a method according to the invention (step S11). The computer then executes the steps in a method according to the invention, in sequence, particularly the steps to detect ports, select, sort, create a matrix and calculate equivalent resistances.

The computer 302 may be an isolated computer or it may be connected to a network. It may also be connected to other computers 324 through communication means 320 such as the Internet.

The computer or the microcomputer 302 is configured in an appropriate way for processing information about a circuit using a method conforming with the invention. It comprises a calculation section with all electronic components, software and other components necessary to implement a method according to the invention, for example like that shown in FIG. 4.

Figure 8B:
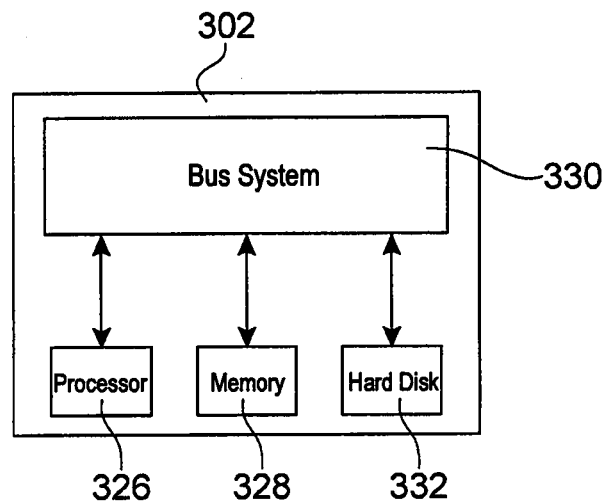

Thus for example (FIG. 8B), it comprises a programmable processor 326, a memory 328 and an input peripheral, for example a hard disk 332, coupled to a system bus 330. The processor may for example be a microprocessor, or a system unit processor. For example, the memory 328 may be a hard disk, a read only memory ROM, a compact optical disk, a dynamic random access memory DRAM or any other type of RAM memory, a magnetic or optical storage element, registers or other volatile and/or non-volatile memories. A processing algorithm according to the invention comprises instructions that can be stored in memory and that can be used to perform operations like that shown in FIG. 4 and that were described above, or more generally operations in any one of the embodiments of a method according to this invention.

There is a program for implementing a method according to the invention that may be resident or may be recorded on a medium (for example a diskette or a CD ROM or a DVD ROM or a USB key, or a removable hard disk or a magnetic medium) that can be read by a computer system or by the microcomputer 302.

The microcomputer 302 may also be connected to other peripherals, for example printing peripherals. It can also be connected to an Internet type electronic network to send data about the simulation results.

An image representing a result of the calculation of resistive values can also be displayed on a screen, possibly together with an image of the resistors and their couplings.

For example, knowledge of the resistive values can form a basis for deciding whether two electrical lines provide the same resistance to current, or if an electrical line is well matched to the output from a block or a component.

Once the designer has satisfactorily tested the circuit, it can be fabricated and physically tested.

Circuit manufacturing means, like those known in the semi-conductors and integrated circuits industry, can then be used as soon as the simulation result obtained with a system for simulating an electronic circuit according to the invention is satisfactory.

Therefore, a method and a device according to the invention play an important role in manufacturing an integrated circuit because they can result in a considerable time saving in producing and manufacturing such a circuit.

The invention can beneficially be applied to a large network or circuit (for example with 1000 or 1 million or more ports).

The invention claimed is:

1. A method for verifying the design of an electronic circuit represented in the form of masks and connections, the method comprising:
using a computer to:
(a) define the circuit, using one or more extraction programs, in the form of a first list of electrical components and connections between them, the first list identifying resistive and non-resistive components of the circuit from a layout obtained from lithographic masks or descriptions of lithographic masks of the electronic circuit;
(b) identify entry ports and exit ports of said electronic circuit, said entry ports and exit ports being known from the layout of the circuit;
(c) select from said list only the resistive components of said electronic circuit;
(d) produce a matrix of resistances from the selected resistive components, the matrix of resistances using a resistance network tree representation having Nc vertices and Nb branches and comprising a set in matrix form of a value $R_{TT}$ representing a vector of branch resistors, a value $R_{CT}$ representing a vector of resistors of a co-tree connected in parallel, and a value $R_{CC}$ representing a vector of resistors of the co-tree;
(e) calculate equivalent resistances of the matrix of resistances; and
(f) use the calculated equivalent resistances to perform tests on the electronic circuit design,
the method further comprising:
modifying the electronic circuit design or commencing production of the electronic circuit depending on the outcome of the tests.

2. The method according to claim 1, wherein step (d) comprises:
defining a resistive network having an integer number ($N_c$) of vertices and an integer number ($N_b$) of branches, each branch being associated with a resistor $R_i$, where i is an integer number associated with a particular resistor;
constructing a tree T of the resistive network with size $N_t$ with an associated co-tree CT;
establishing meshed equations of the branches $N_b$ of the resistive network; and
establishing the matrix of resistances based on currents associated with the branches $N_b$.

3. The method according to claim 2, wherein the matrix of resistances comprises:
a vector of branch resistance vector $R_{TT}$ of tree T,
a vector of resistances of co-tree CT connected in parallel, and
a vector of resistances of co-tree CT.

4. The method according to claim 1, wherein step (e) comprises a reduction in the matrix of resistances by integrating cycle equations.

5. A method for verifying the design of an electronic circuit represented in the form of masks and connections, the method comprising:
using a computer to:
(a) define the circuit, using one or more extraction programs, in the form of a first list of electrical components and connections between them, the first list identifying resistive and non-resistive components of the circuit from a layout obtained from lithographic masks or descriptions of lithographic masks of the electronic circuit;
(b) identify entry ports and exit ports of said electronic circuit, said entry ports and exit ports being known from the layout of the circuit;
(c) select from said list only the resistive components of said electronic circuit;
(d) produce a matrix of resistances from the selected resistive components, comprising the steps of:
defining a resistive network having an integer number ($N_c$) of vertices and an integer number ($N_b$) of branches, each branch being associated with a resistor $R_i$, where i is an integer number associated with a particular resistor;

constructing a tree T of the network with size $N_t$ with the associated co-tree CT;

establishing meshed equations of the tree T based on Kirchhoff's laws;

establishing the matrix of resistances, wherein the matrix of resistances comprises:

the vector of branch resistance vector $R_{TT}$ of tree T, the vector of resistances of co-tree CT connected in parallel, and the vector of resistances of co-tree CT; and (e) calculate equivalent resistances, comprising a reduction in the matrix of resistances by integrating cycle equations; and (f) perform, using the calculated equivalent resistances, tests on the electronic circuit design, the method further comprising:

modifying the electronic circuit design or commencing production of the electronic circuit depending on the outcome of the tests.

6. A device for calculating resistive values of an electronic circuit, represented in the form of masks and connections, comprising a computer that performs:

a) receiving from one or more extraction programs a definition of the circuit in the form of a first list of electrical components and connections between them, the first list identifying resistive and non-resistive components of the circuit from a layout obtained from lithographic masks or descriptions of lithographic masks of the electronic circuit;

b) identifying entry ports and exit ports of said electronic circuit, said entry ports and exit ports being known from the layout of the circuit;

c) selecting from said list only the resistive components of said electronic circuit;

d) producing a matrix of resistances from the selected resistive components, the matrix of resistances using a resistance network tree representation having Nc vertices and Nb branches and comprising a set in matrix form of a value $R_{TT}$ representing a vector of branch resistors, a value $R_{CT}$ representing a vector of resistors of a co-tree connected in parallel, and a value $R_{cc}$ representing a vector of resistors of the co-tree; and e) calculating equivalent resistances of the matrix of resistances.

7. The device according to claim 6, said computer further producing a matrix of resistances comprising:

defining a resistive network having an integer number ($N_c$) of vertices and an integer number ($N_b$) of branches, each branch being associated with a resistor $R_i$, where i is an integer number associated with a particular resistor;

building up a tree T with size $N_t$ of the resistive network and an associated co-tree CT;

establishing meshed equations of the branches $N_b$ of the resistive network; and establishing the matrix of resistances based on currents associated with the branches $N_b$.

* * * * *